United States Patent [19]

Malm

[11] Patent Number: 4,633,190
[45] Date of Patent: Dec. 30, 1986

[54] VOLTAGE AND CURRENT SOURCE FLUCTUATION COMPENSATOR AND METHOD

[75] Inventor: Robert E. Malm, Pacific Palisades, Calif.

[73] Assignee: Northrop Corporation, Hawthorne, Calif.

[21] Appl. No.: 760,704

[22] Filed: Jul. 30, 1985

Related U.S. Application Data

[63] Continuation-in-part of Ser. No. 667,515, Nov. 1, 1984, abandoned.

[51] Int. Cl.[4] .............................................. H03F 1/30
[52] U.S. Cl. .................................... 330/149; 330/199; 330/297
[58] Field of Search ................... 330/124 D, 127, 149, 330/199, 202, 277, 297

[56] References Cited

U.S. PATENT DOCUMENTS

| | | | |
|---|---|---|---|
| 3,423,689 | 1/1969 | Miller et al. | 330/202 X |
| 4,079,333 | 3/1978 | Tanada | 330/297 X |
| 4,338,633 | 7/1982 | Malm | 357/30 X |
| 4,535,303 | 8/1985 | Schoofs et al. | 330/297 |

Primary Examiner—Eugene R. LaRoche
Assistant Examiner—Steven J. Mottola
Attorney, Agent, or Firm—Terry J. Anderson; Robert B. Block

[57] ABSTRACT

A compensator for maintaining the amplification of one or more electronic signal amplifiers independent of fluctuations in the voltage and/or currents supplied to the amplifiers from voltage and/or current sources. A dummy amplifier is used which is substantially similar to the amplifier whose amplification is to be compensated and which is connected to the same sources. The changes in the output of the dummy amplifier are amplified and used to control a variable load which loads down, or alters, one or more of the voltage or current sources to the extent necessary to maintain the output of the dummy amplifier independent of variations in the voltage and/or current sources. Since the output of the dummy amplifier is maintained constant independent of supply variations, the outputs of the similar, electronic signal amplifiers also are maintained independent of supply variations.

7 Claims, 4 Drawing Figures

4,633,190

VOLTAGE AND CURRENT SOURCE FLUCTUATION COMPENSATOR AND METHOD

This application is a continuation-in-part of my co-pending application 667,515, filed Nov. 1, 1984, now abandoned.

BACKGROUND OF THE INVENTION

This invention pertains generally to voltage and current source regulators. More particularly, this invention pertains to devices for compensating for the effects of voltage and current source fluctuations for use with one or more amplifiers both with and without operating points which are periodically reset by clamping.

Simple voltage regulators and current regulators which maintain the voltage or current at a constant level substantially independent of variations in the amount of power drawn from the sources are well known in the art. In a simple series-type voltage regulator for instance, the supply voltage drop across the variable resistance compensates for any variation in the supply voltage so that the output voltage remains substantially constant. In similar regulation devices for current sources, the output current is sensed and compared to a standard and any deviation from the standard is amplified and applied so as to remove the deviation or fluctuation.

In some circumstances an electronic device requires voltages and or currents from a number of different sources. In the prior art a separate regulator for each of the sources has been used to remove any fluctuations from each of the sources and thus avoid variations in the operation of the device caused by variations in the voltage or current obtained from these sources. This prior art method for avoiding fluctuations in the operation of the electronic device due to voltage and current supply variations is inefficient because it uses a separate regulator for each of the current and voltage sources.

In applications where many separate amplifiers are connected to the same current and voltage sources, the failure to adequately regulate the sources can cause cross-talk between the amplifiers. Accordingly, in such applications all of the sources must be individually regulated or some other means must be used to compensate for, or remove the effect of, the fluctuations in the voltage and current sources.

SUMMARY OF THE INVENTION

The present invention does not separately regulate each of the voltage or current sources but instead introduces compensating effects in such a manner that the operation of the device or devices is unaffected by the composite variations in the voltage and/or current supplies. For instance, in the case of a signal amplifier, this invention maintains the operation of the signal amplifier unaffected by supply variations. The invention uses a second dummy signal amplifier which also is connected to the same voltage and current sources that are connected to the real signal amplifier. The dummy signal amplifier is constructed in substantially the same manner as the signal amplifier (the real amplifier) whose operation is to be maintained independent of supply fluctuations. The invention is referred to here as the compensator.

In application of this invention to circuits using clamped techniques, the quiescent, or operating points of the dummy signal amplifier and the real amplifier are periodically reset to predetermined levels by periodically clamping the levels of all the amplifiers. Any fluctuations in the output of the dummy signal amplifier during the unclamped periods of operation are used to alter one or more of the voltage or current sources so as to maintain the output of the dummy signal amplifier constant during such unclamped periods. This compensates for variations in the voltage or current sources so as to maintain the operation of the dummy signal amplifier constant. Since the real signal amplifier is practically identical to the dummy signal amplifier and is connected to the same voltage and current sources it also is compensated at the same time so that its output is substantially independent of, and unaffected by, variations in the voltage and current supplies which occur within an unclamped period of operation.

DESCRIPTION OF THE PREFERRED EMBODIMENTS

Figure 1:
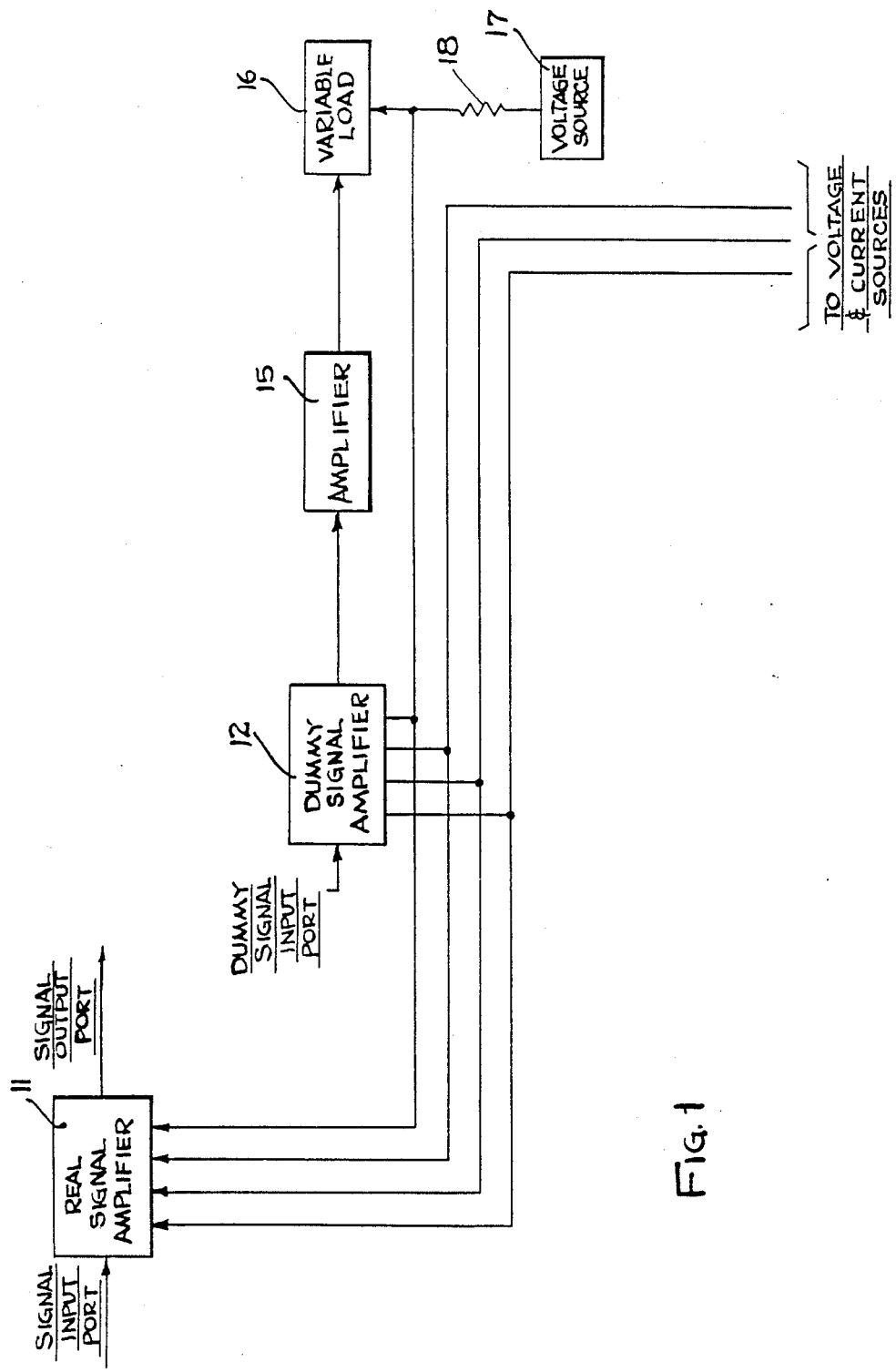
FIG. 1 is a block diagram of the voltage and current source fluctuation compensator constructed in accordance with the present invention.

As illustrated in the block diagram shown in FIG. 1, real signal amplifier 11 is connected to a plurality of voltage and/or current sources including voltage source 17. Real signal amplifier 11 has a signal input port and signal output port. A signal input to the signal input port is amplified by real signal amplifier 11 producing an output from the signal output port. The object of this invention is to compensate for fluctuations in the voltages and currents supplied by the voltage and/or current sources connected to real signal amplifier 11 so as to maintain the signal output by real signal amplifier 11 substantially independent of variations in the voltages and/or currents from the respective voltage and/or current sources.

As indicated in FIG. 1, real signal amplifier 11 is connected indirectly to voltage source 17 through resistor 18. The variable load 16 also is connected to voltage source 17 indirectly through resistor 18. In operation, the invention adjusts the current drawn by variable load 16 through resistor 18 so as to alter the voltage supplied to real amplifier 11 by voltage source 17. The voltage supplied by voltage source 17 is altered by variable load 16 to the extent necessary to maintain the signal output by real signal amplifier 11 independent of the voltage and current source fluctuations.

The amount of current which must be drawn by variable load 16 to effect the compensation is determined by the compensator in the following manner. Dummy signal amplifier 12, which is substantially the same as real signal amplifier 11, is connected in the same manner as signal amplifier 11 to voltage source 17 through resistor 18 and also is connected to the other voltage and current sources in the same manner as real signal amplifier 11. As shown in more detail in FIG. 2, the input connection to dummy signal amplifier 13 also is connected through circuit elements, in the same or equivalent manner as real signal amplifier 11, to the voltage and current sources with the exception that no time varying signal is introduced into the input of dummy signal amplifier 13 other than that due to variations which may occur in the voltage and current sources.

Any changes in the voltage or current output by dummy signal amplifier 12 is amplified by amplifier 15. The output of amplifier 15, in turn, controls variable load 16 so as to change the amount of current drawn through resistor 18 so as to alter the voltage supplied by source 17 to both real signal amplifier 11 and dummy signal amplifier 12 to the extent necessary to maintain the voltage or current output by dummy signal amplifier 12 at a nearly constant level.

Dummy signal amplifier 12 is substantially the same as real signal amplifier 11. As a consequence, the magnitude of the voltage or current output by both amplifiers fluctuates in the same manner in response to variations in the voltage and current supplied to them by the voltage and current sources. Thus, the adjustment by the compensator of the voltage supplied to real signal amplifier 11 and dummy signal amplifier 12 from voltage source 17 by variable load 16 so as to maintain the magnitude of the voltage or current output by dummy signal amplifier 12 independent of the variations in the voltages and current supplied by the voltage and current sources, also maintains the signal output by real signal amplifier 11 substantially independent of the same variations.

It should be understood that more than one variable load 16 could be connected to more than one of the voltage or current sources so as to adjust the voltages or currents from a plurality of these sources. The variable loads could then be controlled by amplifier 15 so as to maintain the signals output by both real signal amplifier 11 and dummy signal amplifier 12 substantially independent of the fluctuations in the voltages and current supplied by all of the voltages and current sources. It should also be understood that a variable load could be used in conjunction with a current source so as to vary the current supplied by the current source and thus compensate the operation of the amplifiers. It is also not necessary to have all voltage and/or current sources connected to both the real signal amplifier and the dummy signal amplifier, it is only necessary to connect those voltage and/or current sources to both the real signal amplifier and the dummy signal amplifier for which the fluctuations in those sources are to be compensated by this invention. The term "supply source" is meant to include, voltage sources, current sources, or any combination of these sources.

It should be further understood that a plurality of similar, real signal amplifiers can be connected in parallel to the same voltage and current sources and that the outputs of all of the real signal amplifiers will be maintained nearly independent of source fluctuations by the single compensator using a single dummy amplifier.

Figure 2:
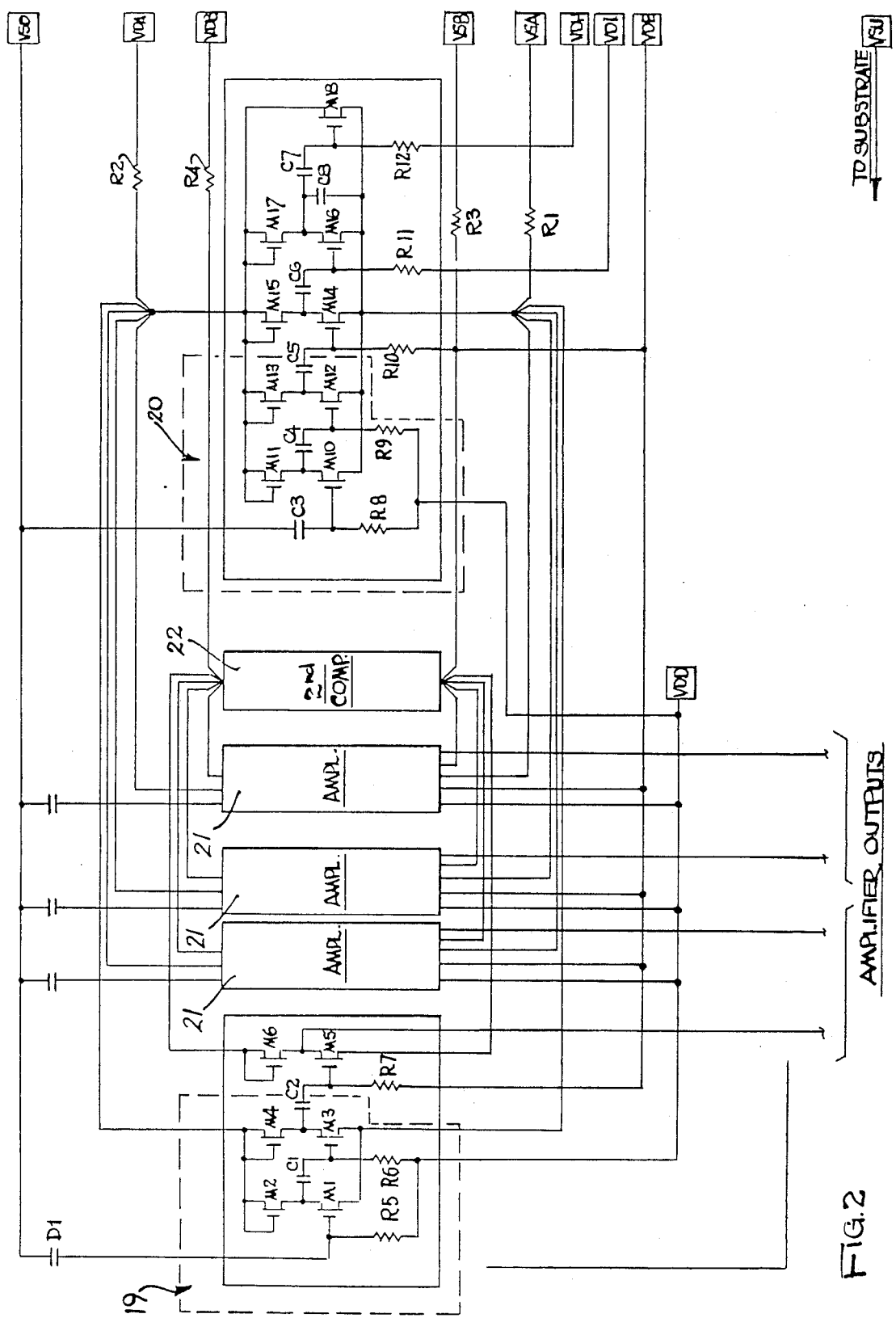
FIG. 2 is a schematic diagram of portions of the embodiment of FIG. 1.

FIG. 2 is a schematic diagram illustrating an embodiment of this invention for the compensation of a set of identical amplifiers that could be used for reading out a set of pyroelectric infrared radiation detectors of the capacitor type. In FIG. 2, real signal amplifier 11 of FIG. 1 consists of the field effect transistors and coupling capacitors located within the dotted line denoted 19 in FIG. 2 and the dummy signal amplifier 12 of FIG. 1 consists of the field effect transistor and coupling capacitors located within the dotted line denoted 20 in FIG. 2. As indicated in FIG. 2, the interconnection of the transistor and coupling capacitors encircled by dotted line 20 is the same as those encircled by dotted line 19. As indicated above, dummy signal amplifier 12 is constructed in substantially the same manner as real signal amplifier 11 so that the responses of the two amplifiers to voltage and current variations will be similar. Real signal amplifier 11, whose elements are enclosed by dotted line 19 in FIG. 2, is a two-stage amplifier composed of field effect transistors (FETs) M1 and M3 and coupling capacitors C1 and C2. The FETs labeled M2 and M4 operate as loads for the two amplifiers. The quiescent or operating points of the amplifier stages are established by bias voltage VDD through resistors R5 and R6. Resistors R5 and R6 should be large compared to the input impedance of the associated FETs.

In FIG. 2 the various square boxes represent voltage sources and the boxes with labels consisting of three letters which begin with the letter V represent constant voltage sources.

In the embodiment illustrated in FIG. 2, the compensator operates to maintain the signal output by real signal amplifier; i.e., of the FETs labeled M1 and M3, substantially independent of the voltages supplied by voltage sources VSA, VDA and VSD, by altering the voltages supplied to real signal amplifier 11 by voltage sources VSA and VDA. As illustrated in FIG. 2, the voltage sources, for whose fluctuations the compensator is intended to compensate, are connected in a similar fashion to the elements enclosed by dotted line 19 and to the elements enclosed by dotted line 20; that is, to real signal amplifier 11 and dummy signal amplifier 12. Referring to FIG. 2, the FET labeled M18 acts as a variable load connected between voltage sources VDA and VSA and operates to alter the difference between these voltage levels so as to maintain the output from dummy signal amplifier 12 constant. In the example illustrated in FIG. 2, the variable load is actually connected between two sources, VSA and VDA, rather than only across the output of one source. It should be recognized, however, that even though the variable load is connected between two sources, it continues to operate in essentially the same manner, because, by drawing current through resistors $R_1$ and $R_2$, it alters the voltages supplied by VSA and VDA to the amplifiers.

In FIG. 2, the source of the signal which is input to, and amplified by, real signal amplifier 11 is depicted schematically as capacitor D1. The origins of the signal to be amplified by the amplifier are pyroelectric materials sandwiched between metal plates which have been exposed to varying amounts of infrared radiation. The signal appearing at the input to the real signal amplifier results from changes in polarization of the pyroelectric material that comprises capacitor D1 and appears as a varying charge across capacitor D1.

The input to dummy signal amplifier 12, as referrd to in FIG. 1, which in FIG. 2 is the gate of FET M10, is connected through fixed capacitor C3 to supply voltage VSD. Capacitor C3 is fixed in value and fixed and charge and thus the signal appearing on the gate of FET M10 remains constant except for those variations in charge caused by variations in the voltage from voltage source VSD. C3 is fixed at a value approximately equal to the average value of capacitor D1. In practice, a number of amplifiers 21 similar to real signal amplifier 11 would be connected to voltage sources VDA, VDB, VSA and VSB. Because these amplifiers all are substantially identical to dummy signal amplifier 12 and all are connected to the same sources, the compensator maintains the amplifications of all of these amplifiers substantially independent of variations in the voltages and currents from the sources. These additional amplifiers are depicted FIG. 2 simply by boxes and not in detail.

In the preferred embodiment, a third stage of amplification is obtained by the FET denoted M5 in FIG. 2 operating in conjunction with the FET labeled M6 which operates as a load, and biased by voltage VDE through resistor R7. The amplification of FET M5 and of the similar FETs in the other amplifiers 21 is maintained independent of fluctuations in the voltages supplied to M5 by a second compensator 22. The operation of second compensator 22 with respect to FET M5 and the similar components in the other amplifiers is similar to the operation of the first compensator and, as a consequence, compensator 22 will not be described further.

The signal output from dummy signal amplifier 12 (the elements enclosed in dotted line 20 in FIG. 2) is output through capacitor C5, then amplified by FETs M14 and M16, and then applied to FET M18, which operates as the variable load between the voltage sources VSA and VDA. Capacitor C8 controls the response time of the output from M16 so as to maintain the stability of the compensator system. An even number of stages of amplification must be used between the output from C5 and the variable load provided by FET M18 in order to maintain stability in the feedback loop of the compensator.

Initial operating conditions for the amplifiers and compensators are established in FIG. 2 by bias voltages VDD, VDE, VDH and VDI through resistors R8, R9, R10, R11 and R12. The values of these resistors should be larger compared to the input impedances of the associated FETs. The M16 and M18 amplifier stages do not appear in the signal amplifiers. Consequently, the biasing voltages VDH and VDI for these stages should be supplied by independently-regulated power supplies.

Figure 3:
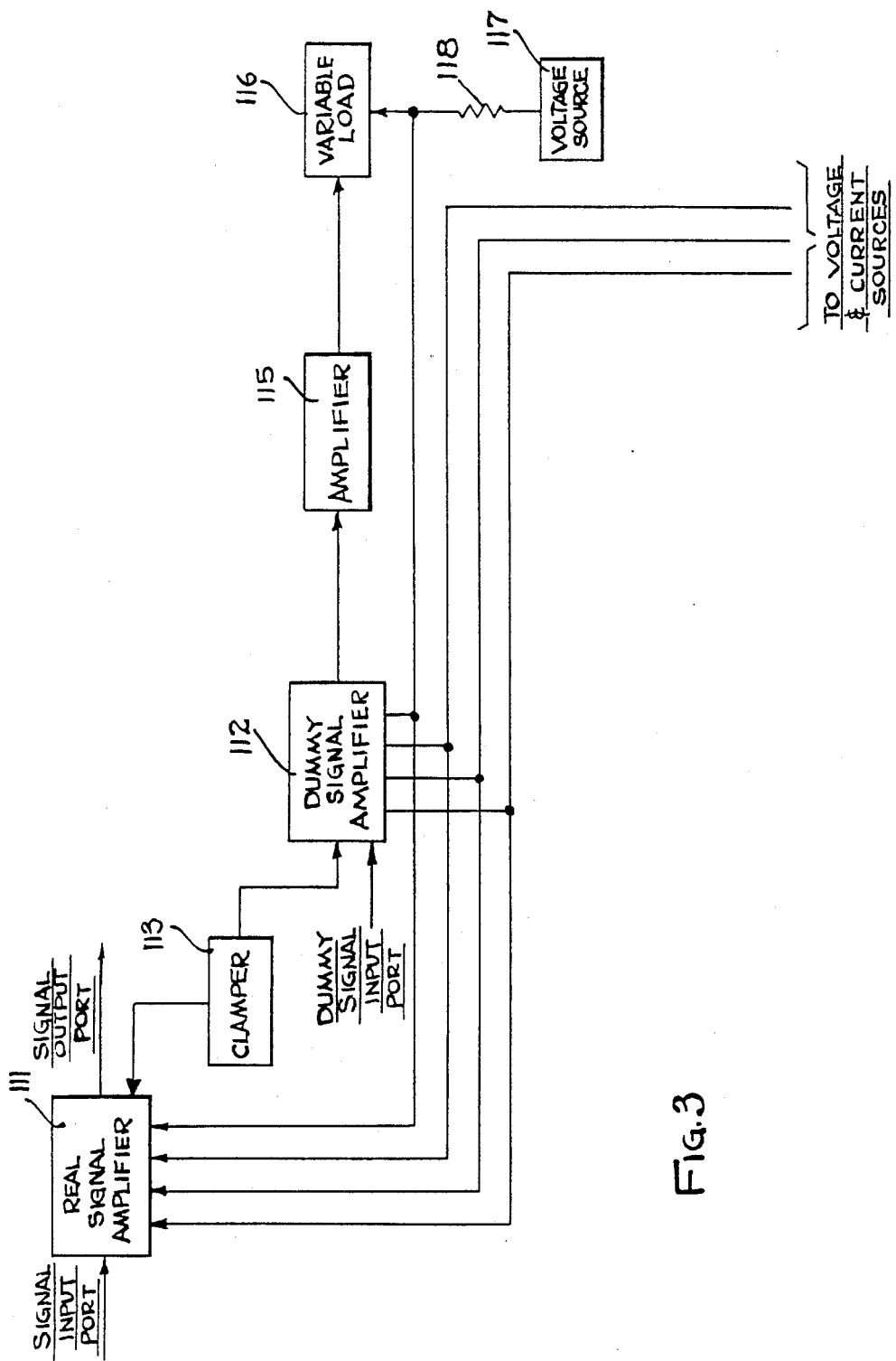
FIG. 3 is a block diagram of a voltage and source fluctuation compensator constructed in accordance with a second embodiment of the invention for use with amplifiers whose operating points are periodically reset by clamping.

The application of this invention to amplifiers which use dynamic biasing techniques is shown in FIG. 3. The quiescent or operating points of real signal amplifier 111 and of dummy signal amplifier 112 are periodically reset by clamper 113. During unclamped periods, any change in the voltage or current output by dummy signal amplifier 112 is amplified by amplifier 115. The output of amplifier 115, in turn, controls variable load 116 so as to change the amount of current drawn through resistor 118 so as to alter the voltage supplied by source 117 to both real signal amplifier 111 and dummy signal amplifier 112 to the extent necessary to maintain the voltage or current output by dummy signal amplifier 112 at a nearly constant level.

Dummy signal amplifier 112 is substantially the same as real signal amplifier 111. As a consequence, during unclamped periods the magnitude of the voltage or current output by both amplifiers fluctuates in the same manner in response to variations in the voltage and current supplied to them by the voltage and current sources. Thus, the adjustment by the compensator of the voltage supplied to real signal amplifier 111 and dummy signal amplifier 112 from voltage source 117 by variable load 116 so as to maintain the magnitude of the voltage or current output by dummy signal amplifier 112 independent of the variations in the voltages and current supplied by the voltage and current sources, also maintains the signal output by real signal amplifier 111 substantially independent of the same variations.

It should be understood that more than one variable load 116 could be connected to more than one of the voltage or current sources so as to adjust the voltages or currents from a plurality of these sources. The variable loads could then be controlled by amplifier 115 so as to maintain the signals output by both real signal amplifier 111 and dummy signal amplifier 112 substantially independent of the fluctuations in the voltages and current supplied by all of the voltages and current sources. It should also be understood that a variable load could be used in conjunction with a current source so as to vary the current supplied by the current source and thus compensate the operation of the amplifiers. It is also not necessary to have all voltage and/or current sources connected to both the real signal amplifier and the dummy signal amplifier, it is only necessary to connect those voltage and/or current sources to both the real signal amplifier and the dummy signal amplifier for which the fluctuations in those sources are to be compensated by this invention. The term "supply source" is meant to include voltage sources, current sources, or any combination of these sources.

It should be further understood that a plurality of similar, real signal amplifiers can be connected in parallel to the same voltage and current sources and that the outputs of all of the real signal amplifiers will be maintained nearly independent of source fluctuations by the single compensator using a single dummy amplifier.

Figure 4:
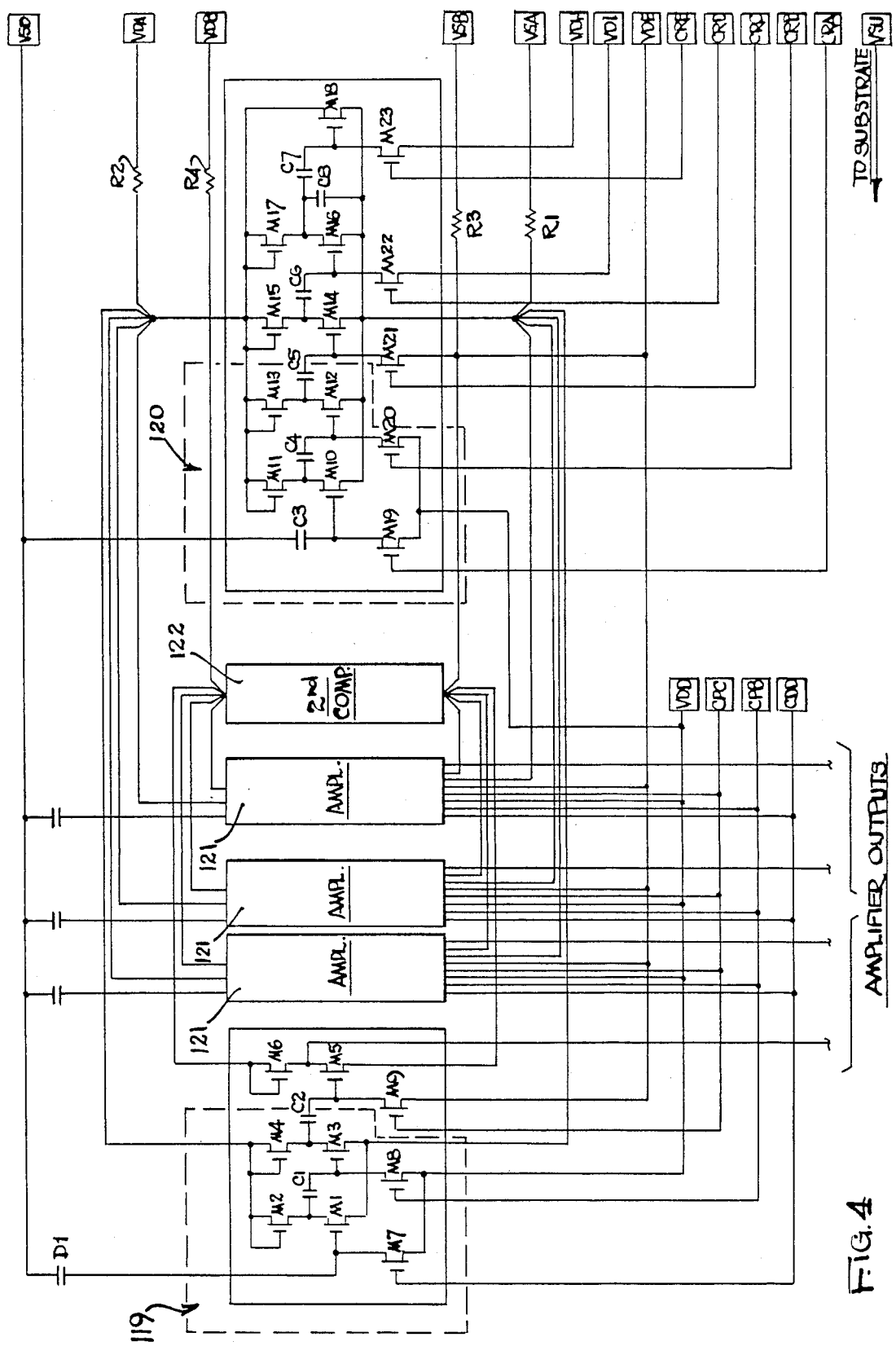
FIG. 4 is a schematic diagram of portions of the embodiment of FIG. 3.

FIG. 4 is a schematic diagram illustrating an embodiment of this invention for the compensation of a set of identical amplifiers used as part of a frame integrator for a charge-injection-device (CID) imaging system such as that described in U.S. Pat. No. 4,338,663. In FIG. 4, real signal amplifier 111 of FIG. 1 consists of the field effect transistors and coupling capacitors located within the dotted line denoted 119 in FIG. 4 and the dummy signal amplifier 112 of FIG. 3 consists of the field effect transistor and coupling capacitors located within the dotted line denoted 120 in FIG. 4. As indicated in FIG. 4, the interconnection of the transistor and coupling capacitors encircled by dotted line 120 is the same as those encircled by dotted line 119. As indicated above, dummy signal amplifier 112 is constructed in substantially the same manner as real signal amplifier 111 so that the responses of the two amplifiers to voltage and current variations will be similar. Real signal amplifier 111, whose elements are enclosed by dotted line 119 in FIG. 4, is a two-stage amplifier composed of field effect transistors (FETs) M1 and M3 and coupling capacitors C1 and C2. The FETs labeled M2 and M4 operate as loads for the two amplifiers and FETs labeled M7 and M8 operates as switches controlled by control voltages denoted in FIG. 4 as CDD and CPB, respectively, to periodically bias the two amplifier stages by clamping the voltages at the gates of M1 and M3 to the voltage supplied by the voltage source VDD. The operation of a signal amplifier, such as that depicted in FIG. 4, as part of a frame integrator for CID images, is described in more detail in U.S. Pat. No. 4,338,633 and reference to that patent is made here for that purpose. Counterparts to capacitor C1 and C2 do not appear in the schematic drawings in U.S. Pat. No. 4,338,633 because these capacitors have been added to the amplifier depicted in FIG. 4 in the course of development of the amplifier system. Nevertheless, the description in U.S. Pat. No. 4,338,633 remains relevant.

In FIG. 4 the various square boxes represent voltage sources and the boxes with labels consisting of three letters which begin with the letter V represent constant voltage sources. The boxes with labels beginning with the letter C represent control voltages which, in a specified time sequence, turn on and off the various field effect transistors so as to clamp or reset the starting voltages of the gates of the field effect transistors in the amplifier and thus periodically reset the quiescent or operating points of the amplifiers. Reference is made here to U.S. Pat. No. 4,338,633 for a more detailed explanation of this switching and clamping process.

In the embodiment illustrated in FIG. 4, the compensator operates to maintain the signal output by real signal amplifier 111; i.e., of the FETs labeled M1 and M3, substantially independent of the voltages supplied by voltage sources VSA, VDA and VSD, by altering the voltages supplied to real signal amplifier 111 by voltage sources VSA and VDA. As illustrated in FIG. 4, the voltage sources, for whose fluctuations the compensator is intended to compensate, are connected in a similar fashion to the elements enclosed by dotted line 119 and to the elements enclosed by dotted line 120; that is, to real signal amplifier 111 and dummy signal amplifier 112. Referring to FIG. 4, the FET labeled M18 acts as a variable load connected between voltage sources VDA and VSA and operates to alter the difference between these voltage levels so as to maintain the output from dummy signal amplifier 112 constant. In the example illustrated in FIG. 4, the variable load is actually connected between two sources, VSA and VDA, rather than only across the output of one source. It should be recognized, however, that even though the variable load is connected between two sources, it continues to operate in essentially the same manner, because, by drawing current through resistors $R_1$ and $R_2$, it alters the voltages supplied by VSA and VDA to the amplifiers.

In FIG. 4, the source of the signal which is input to, and amplified by, real signal amplifier 111 is depicted schematically as capacitor D1. As described in U.S. Pat. No. 4,338,633, the origins of the signal to be amplified by the amplifier are small regions of a semi-conductor material which have been exposed to varying amounts of infrared or optical radiation. The signal appearing at the input to the real signal amplifier results from the transfer of the radiation-created electrical charge of capacitor D1 and appears as a varying charge across capacitor D1.

The input to dummy signal amplifier 112, as referred to in FIG. 3, which in FIG. 4 is the gate of FET M10, is connected through fixed capacitor C3 to supply voltage VSD. Capacitor C3 is fixed in value and fixed in charge and thus the signal appearing on the gate of FET M10 remains constant except for those variations in charge caused by variations in the voltage from voltage source VSD. C3 is fixed at a value approximately equal to the average value of capacitor D1. In practice, the frame integrator comprises a number of amplifiers 111 similar to real signal amplifier 111 which also are connected to voltage sources VDA, VDB, VSA and VSB. Because these amplifiers all are substantially identical to dummy signal amplifier 112 and all are connected to the same sources, the compensator maintains the amplifications of all of these amplifiers substantially independent of variations in the voltages and currents from the sources. These additional amplifiers are depicted in FIG. 4 simply by boxes and not in detail.

In the preferred embodiment, a third stage of amplification is obtained by the FET denoted M5 in FIG. 4 operating in conjunction with the FET labeled M6 which operates as a load, and FET M9, which operates as a switch. The amplification of FET M5 and of the similar FETs in the other amplifiers 111 is maintained independent of fluctuations in the voltages supplied to M5 by a second compensator 112. The operation of second compensator 112 with respect to FET M5 and the similar components in the other amplifiers is similar to the operation of the first compensator and, as a consequence, compensator 112 will not be described further.

The signal output from dummy signal amplifier 112 (the elements enclosed in dotted line 120 in FIG. 4) is output through capacitor C5, then amplified by FETs M14 and M16, and then applied to FET M18, which operates as the variable load between the voltage sources VSA and VDA. Capacitor C8 controls the response time of the output from M16 so as to maintain the stability of the compensator system. An even number of stages of amplification must be used between the output from C5 and the variable load provided by FET M18 in order to maintain stability in the feedback loop of the compensator.

Initial operating conditions for the amplifiers and compensators, as depicted in FIG. 3, are established in FIG. 4 by means of the periodic clamping of the gate voltages applied to FETs M10, M12, M14, M16 and M18 by the switching of FETs labeled M19, M20, M21, M22 and M23. The clamping of the gates is described in more detail in U.S. Pat. No. 4,338,633. The periodic clamping of the voltages, in effect, periodically resets the operation of the compensator so as to reset its reference level at the end of each clamping period. As a consequence, the compensator, depicted in FIG. 4, compensates only for variations in the supply voltages which occur within each period of signal amplification. The compensator does not operate to compensate for fluctuations between successive amplification periods. The object in the frame integrator, however, is to compensate the amplifiers only with respect to supply variations occurring within each amplification period, rather than to compensate for variations between amplification periods.

I claim:

1. A voltage and current source fluctuation compensator for use with an electronic signal amplifier of the type having a signal input port and signal output port and an operating point and having a plurality of power supply inputs to which a plurality of power supply sources are connected, comprising a dummy signal amplifier having input circuitry substantially identical to the signal amplifier, and having a signal input port and a signal output port and an operating point, said dummy signal amplifier being connected to the supply sources in substantially the same manner as the signal amplifier is connected to the supply sources, a compensation amplifier, a variable load connected to one of the supply sources, the compensation amplifier amplifying changes in the output of the dummy amplifier, the variable load loading down one of the supply sources in response to the output by the compensation amplifier, the loading down of said one of the supply sources by the variable load compensates for variations in the power supply sources and substantially removes variations in the signal output from the output of the dummy signal amplifier and the electronic signal amplifier caused by the variations in the power supply sources.

2. A voltage and current source fluctuation compensator for use with an electronic signal amplifier of the type having a signal input port and signal output port and an operating point and having a plurality of supply inputs to which a plurality of supply sources are connected, comprising
 a dummy signal amplifier having substantially the same components and circuitry as the electronic signal amplifier, and having a signal input port and a signal output port and an operating point,
 the dummy signal amplifier being connected to the supply sources in substantially the same manner as the electronic signal amplifier is connected to the supply sources,
 a compensation amplifier,
 a variable load connected to one of the supply sources, clamping means for periodically resetting the operating point of electronic signal amplifier and the operating point of the dummy signal amplifier,
 the compensation amplifier amplifying any change in the output of the dummy amplifier during unclamped periods,
 the variable load loading down one of the supply sources in response to the signal output by the compensation amplifier,
 the loading down to said one of the supply sources by the variable load compensating for variations in the supply sources so as to remove a substantial portion of any variation in the signal output from the output of the dummy signal amplifier and the electronic signal amplifier caused by the variations in the supply sources.

3. A voltage and current source fluctuation compensator for use with an electronic signal amplifier to the type having a signal input port and signal output port and an operating point and having a plurality of supply inputs to which a plurality of supply sources are connected, comprising
 a dummy signal amplifier having substantially the same components and circuitry as the signal amplifier, and having a signal input port and signal output port and an operating point,
 the dummy signal amplifier being connected to the supply sources in substantially the smae manner as the signal amplifier is connected to the supply sources,
 a compensation amplifier,
 a plurality of variable loads connected to a plurality of the supply sources,
 clamping means for periodically resetting the operating point of the electronic signal amplifier and the operating point of the dummy signal amplifier,
 the compensation amplifier amplifying any change in the output of the dummy amplifier during unclamped periods,
 the plurality of variable loads loading down the plurality of supply sources in response to the signal output by the compensation amplifier,
 the loading down of the plurality of the supply sources by the plurality of variable loads compensating for variations in the supply sources so as to remove a substantial portion of any variation in the signal output from the output on the dummy signal amplifier and the electronic signal amplifier caused by the variations in the supply sources.

4. A voltage and current source fluctuation compensator for use with an electronic signal amplifier of the type having a signal input port and signal output port and an operating point and having a plurality of supply inputs to which a plurality of supply sources are connected, comprising.
 a dummy signal amplifier having substantially the same components and circuitry as the signal amplifier, and having a signal input port and a signal output port and an operating point,
 the dummy signal amplifier being connected to the supply sources in substantially the same manner as the signal amplifier is connected to the supply sources,
 a compensation amplifier,
 a variable load connected between two of the supply sources,
 clamping means for periodically resetting the operating point of the electronic signal amplifier and the operating point of the dummy signal amplifier,
 the compensation amplifier amplifying any change in the output in response to the signal output of the dummy signal amplifier,
 the variable load loading down said two of the supply sources in response to the signal output of the compensator amplifier,
 the loading down of said two supply sources by the variable load compensating for variations in the supply sources so as to remove a substantial portion of any variation in the signal output from the output of the dummy signal amplifier and the electronic signal amplifier caused by the variations in the supply sources.

5. A method for compensating an electronic signal amplifier of the type having a signal input port and signal output port and an operating point and having a plurality of supply inputs to which a plurality of supply sources are connected so as to render the operation of the electronic signal amplifier substantially independent of variations in the supply sources, comprising
 connecting a dummy signal amplifier having substantially the same component values and circuitry as the signal amplifier, and having a signal input port and a signal output port and an operating point, to the supply sources in substantially the same manner as the signal amplifier is connected to the supply sources,
 connecting a variable load to one of the supply sources,
 connecting a compensation amplifier to the output of the dummy signal amplifier,
 the compensation amplifier amplifying any change in the output of the dummy amplifier,
 loading down said one of the supply sources by means of the variable load in response to the signal output by the compensation amplifier,
 the loading down of said one of the supply sources by the variable load compensating for variations in the power supply sources so as to remove a substantial portion of any variation in the signal output from the output of the dummy signal amplifier and the electronic signal amplifier caused by the variations in the power supply sources.

6. A method compensating an electronic signal amplifier of the type having a signal input port and signal output port and an operating point and having a plurality of supply inputs to which a plurality of supply sources are connected so as to render the operation of the electronic signal amplifier substantially independent of variations in the supply sources, comprising connecting a dummy signal amplifier having substantially the same components and circuitry as the signal amplifier, and having a signal input port and a signal output port and an operating point, to the supply sources in substantially the same manner as the signal amplifier is connected to the supply sources, connecting a variable load to one of the supply sources, connecting a compensation amplifier to the output of the dummy signal amplifier, connecting a clamping means for periodically resetting the operating point of the electronic signal amplifier and the operating point of the dummy signal amplifier to the dummy signal amplifier and the electronic signal amplifier, the compensation amplifier amplifying any change in the output of the dummy amplifier during unclamped periods, the loading down said one of the supply sources by means of the variable load in response to the signal output by the compensation amplifier, the loading down of said one of the supply sources by the variable load compensating for variations in the power supply sources so as to remove a substantial portion of any variation in the signal output from the output of the dummy signal amplifier and the electronic signal amplifier caused by the variations in the power supply sources.

7. A method for compensating one or more electronic signal amplifiers so as to render the operation substantially independent of variations in the supply sources, comprising connecting a dummy signal amplifier having substantially the same component values and circuitry as the signal amplifier to the supply sources in substantially the same manner as the signal amplifier is connected to the supply sources, connecting a variable load to one of the supply sources, connecting a compensation amplifier to the output of the dummy signal amplifier, the compensation amplifier amplifying any change in the output of the dummy amplifier to thereby load said one supply source in response to the signal output of the compensation amplifier, the loading down of said one of the supply sources by the variable load compensating for variations in the supply sources so as to remove a substantial portion of any variation in the signal output from the output of the dummy signal amplifier and the electronic signal amplifier caused by the variations in the power supply sources.

* * * * *